(12) United States Patent
Ishiga et al.

(10) Patent No.: US 7,323,713 B2
(45) Date of Patent: Jan. 29, 2008

(54) THIN FILM TRANSISTOR ARRAY SUBSTRATE AND METHOD OF PRODUCING THE SAME

(75) Inventors: Nobuaki Ishiga, Kumamoto (JP);
Takuji Yoshida, Kumamoto (JP);
Yuichi Masutani, Tokyo (JP); Shingo Nagano, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 75 days.

(21) Appl. No.: 11/189,980

(22) Filed: Jul. 27, 2005

(65) Prior Publication Data

US 2006/0022199 A1    Feb. 2, 2006

(30) Foreign Application Priority Data

Jul. 27, 2004    (JP) .......................... P.2004-218499

(51) Int. Cl.
*H01L 29/04* (2006.01)

(52) U.S. Cl. ................... 257/59; 257/72; 257/E29.151; 438/149; 438/E29.202; 438/E29.303

(58) Field of Classification Search .................. 257/59, 257/72, 347–353; 438/149
See application file for complete search history.

(56) References Cited

U.S. PATENT DOCUMENTS

| 6,087,678 A * | 7/2000 | Kim ............................ 257/59 |
| 2006/0197085 A1 * | 9/2006 | Kang ........................... 257/59 |

\* cited by examiner

*Primary Examiner*—Quoc Hoang
(74) *Attorney, Agent, or Firm*—Buchanan Ingersoll & Rooney PC (57) ABSTRACT

A method of producing a thin film transistor array substrate which includes an insulating substrate, a display pixel having a pixel electrode connected to a drain electrode, a gate wiring, and a source wiring perpendicular to the gate wiring, comprising forming a first thin metal multi-layer film an upper layer of which includes aluminum, and spreading a photo-resist, forming the photo-resist to a thickness less in an area connected to a second thin metal film than other area, patterning the first thin metal film, reducing a thickness of the photo-resist layer and removing the photo-resist in the area, removing the upper layer in the area to expose a lower layer, forming an interlayer insulating film and patterning it to expose the lower layer in the area, and patterning the second thin metal film to include the area, to connect the lower layer to the second thin metal film.

7 Claims, 11 Drawing Sheets

THIN FILM TRANSISTOR ARRAY SUBSTRATE AND METHOD OF PRODUCING THE SAME

BACKGROUND OF THE INVENTION

1. Field of the Invention

The present invention relates to a thin film transistor array substrate (hereinafter referred to as "TFT array substrate") including a thin film transistor (hereinafter referred to as "TFT") used as a switching element for active matrix type display device.

2. Description of the Related Art

As one of flat panel displays substituting for CRT, an electro-optical element for display including liquid crystal or electroluminescence has been extensively studied for application to products characterized by a low power consumption or small thickness. For example, a liquid crystal display device normally includes a liquid crystal panel having a liquid crystal layer interposed between a TFT array substrate and an opposite substrate having a color filter, a polarizing plate provided outside the liquid crystal panel and a backlight unit and a light source provided on the other outer side of the substrate. Light emitted by the light source is caused by the backlight unit to hit and pass through the polarizing plate and the liquid crystal panel to obtain a color image display. An electroluminescence display device includes an electroluminescent light-emitting layer and an opposite electrode formed on the aforementioned TFT array substrate. When electric current flows through the light-emitting layer, light can be displayed.

TFT's and pixel electrodes are aligned in a matrix pattern on the aforementioned TFT array substrate. The pixel electrodes each are connected to the drain electrode of the respective TFT. An interlayer insulating film is formed interposed between the drain electrode of TFT and the pixel electrode. The drain electrode of TFT and the pixel electrode are connected to each other through a contact hole formed in the interlayer insulating film. In general, the pixel electrode is made of a transparent electrically-conductive material such as indium oxide and zinc oxide. However, when the drain electrode is made of aluminum or aluminum alloy, an oxide layer is produced at the interface with the transparent electrically-conductive material, causing the rise of contact resistance. Therefore, as the material of drain electrode which comes in contact with the transparent electrically-conductive material there has been mostly used a high melting point metal having a reducing power such as chromium and titanium.

However, the recent trend is for more display devices including liquid crystal or electroluminescence to replace other display devices and find wider application. This trend is accompanied by the requirements for wider, finer and brighter screen. In order to maintain a good image quality even in a wide screen, it is necessary that the rise of the wiring resistance accompanying the increase of the screen size be inhibited. However, since the increase of the width of wiring causes the reduction of the light transmission area, i.e., percent opening and hence the reduction of brightness, it is necessary that a wiring material having a low resistivity such as aluminum or aluminum alloy be used.

Further, when the drain electrode is made of aluminum or aluminum alloy, there arises a problem that the contact resistance of the drain electrode with respect to the pixel electrode increases. In order to solve this problem, an approach has been proposed which includes forming an electrically-conductive film made of metal other than aluminum on the uppermost surface of the drain electrode (see, e.g., JP-A-4-253342 (lines 4-31, right column, page 3, FIG. 1)). To this end, however, it is necessary that a depositing or patterning step be added, leading to cost rise.

Further, an approach has been proposed which includes etching and removing the aluminum or aluminum alloy film on the uppermost layer of the drain electrode which has been exposed at the time of formation of a contact hole in the interlayer insulating film on the drain electrode (see, e.g., JP-A-9-244062 (line 12, right column, page 5-line 4, left column, page 7, FIGS. 5 and 6)). However, when such an isotropic etching method as wet etching is used, the horizontal side etching of the aluminum or aluminum alloy film proceeds, causing the side wall of the interlayer insulating film to be shaped such that it comes in no contact with and is separated from the drain electrode, that is, it is in the form of visor. Accordingly, the transparent electrically-conductive film which acts as a pixel electrode cannot be sufficiently covered, making it likely that poor conduction to the substrate metal film can occur.

On the other hand, it has been occasionally practiced to use not only light from backlight unit but also external light as a light source for the liquid crystal display device for the purpose of saving power consumption or enhance viewability in bright places. This process involves the formation of a transparent pixel electrode which transmits light as well as a reflective pixel electrode made of a material having a high light reflectance in the visible light range such as aluminum and silver on the upper part of TFT whereby external light incident on the liquid crystal panel is reflected and used as display light (see, e.g., JP-A-11-109417 (FIG. 1)). However, as can be seen from its configuration, the reflective pixel electrode is normally formed before or after the formation of the transparent electrode, requiring the addition of one step that adds to cost.

When the uppermost layer of the drain electrode is formed by aluminum or aluminum alloy so that it can act also as a reflective pixel electrode, the addition of such a step is not needed. However, the connection of the transmissive pixel electrode to the drain electrode raises a contact problem as mentioned above. Further, display devices including a reflective pixel electrode but free of transmissive pixel electrode, too, have a similar contact problem when packaged by covering the wiring terminal exposure area with an oxide-based electrically-conductive film such as indium oxide.

SUMMARY OF THE INVENTION

The invention is intended to a TFT capable of forming a reflective pixel electrode without adding to the number of photo-mask or steps and inhibiting the rise of contact resistance to solve these problems with display devices including a wiring and an electrode formed by an upper layer made of aluminum.

The thin film transistor array substrate according to the invention includes a first multi-layer thin metal film including an upper layer made of aluminum formed on the insulating substrate and a second thin metal film formed by a transparent electrically-conductive film formed on the first thin metal film with an interlayer insulating film interposed therebetween, wherein the interlayer insulating film has an opening in which the lower layer of the first thin metal film and the second thin metal film are connected to each other and the side wall of the interlayer insulating film comes in contact with the first thin metal film or the lower metal film.

In accordance with the method of producing a thin film transistor array substrate according to the invention, the contact resistance of a drain electrode formed by processing the laminate of an uppermost layer and a lower layer made of a low resistivity aluminum or aluminum alloy material with respect to the pixel electrode can be lowered without adding to the number of photo-mask or film forming steps, making it possible to obtain a good image quality when the thin film transistor array substrate of the invention is applied to a wide screen display device having a long wiring length.

In accordance with the method of producing a thin film transistor array substrate according to the invention, the uppermost layer made of aluminum is used also as a reflective pixel electrode, making it possible to obtain a thin film transistor having a reflective pixel electrode without adding to the number of photo-mask and hence inhibit the cost rise.

DETAILED DESCRIPTION OF THE INVENTION

The TFT array substrate for display device according to an embodiment of implementation of the invention will be described hereinafter in connection with the attached drawings.

EMBODIMENT 1

Figure 1:
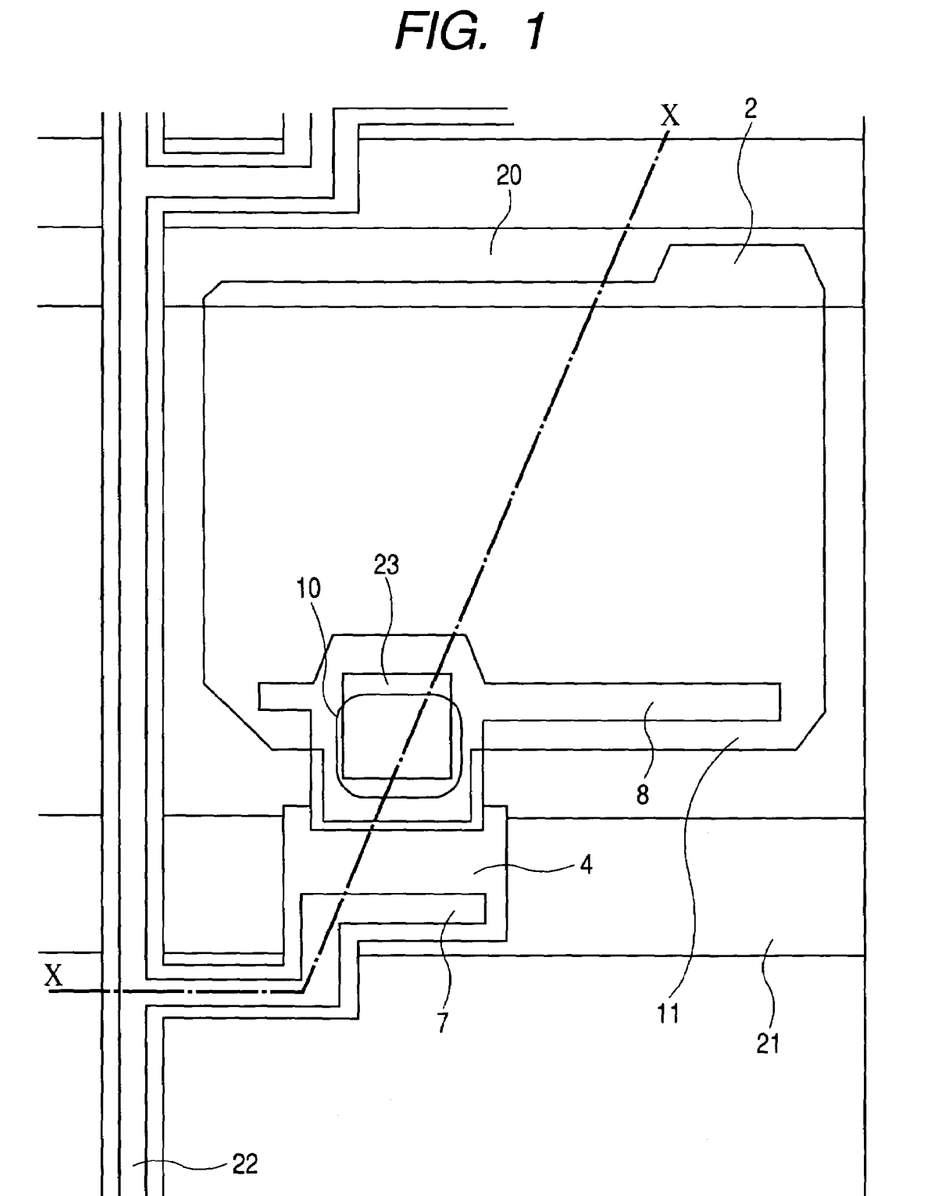
FIG. 1 is a top view of a TFT array substrate according to Embodiment 1 of implementation of the invention.
Figure 2A:
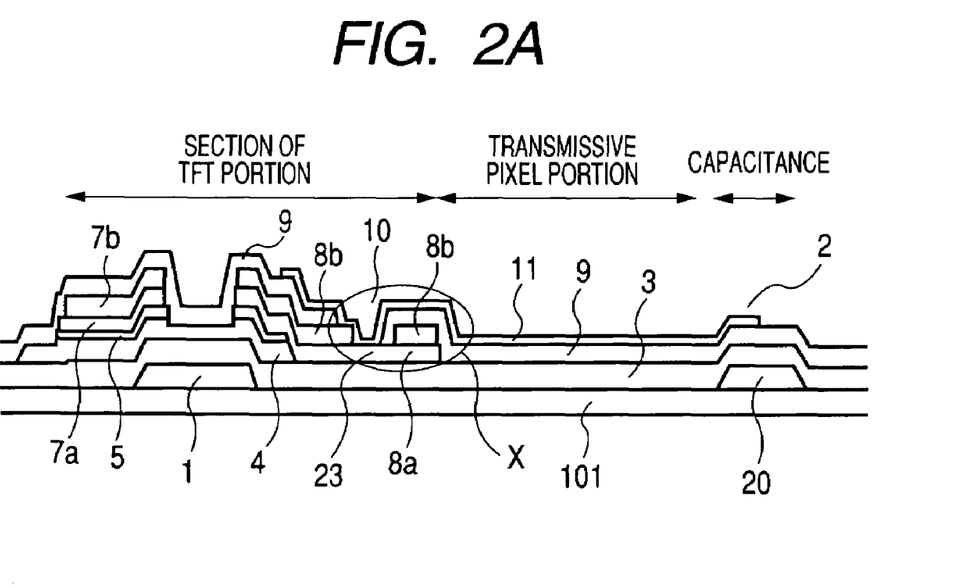
FIGS. 2A and 2B are sectional views of the TFT array substrate according to Embodiment 1 of implementation of the invention.
Figure 2B:
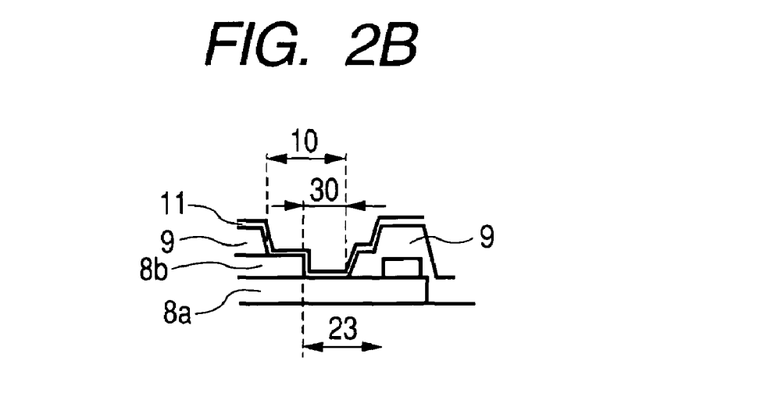
Figure 9A:
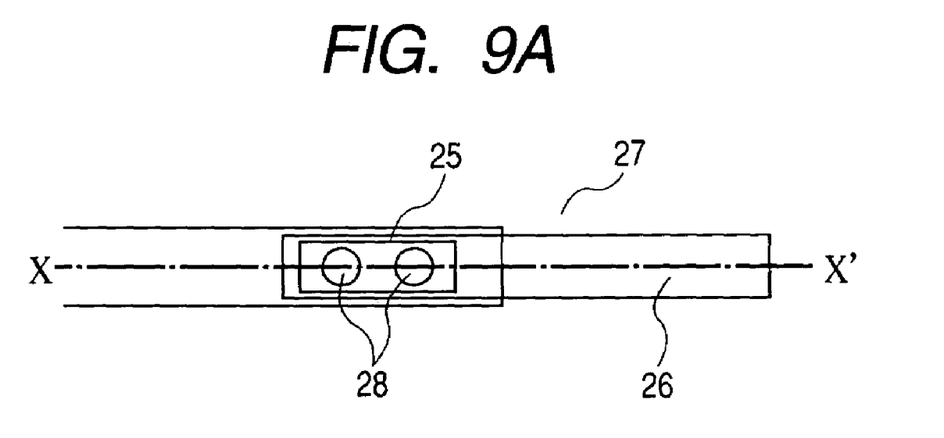
FIGS. 9A and 9B are a top view and a sectional view of a source terminal according to the invention, respectively.
Figure 9B:
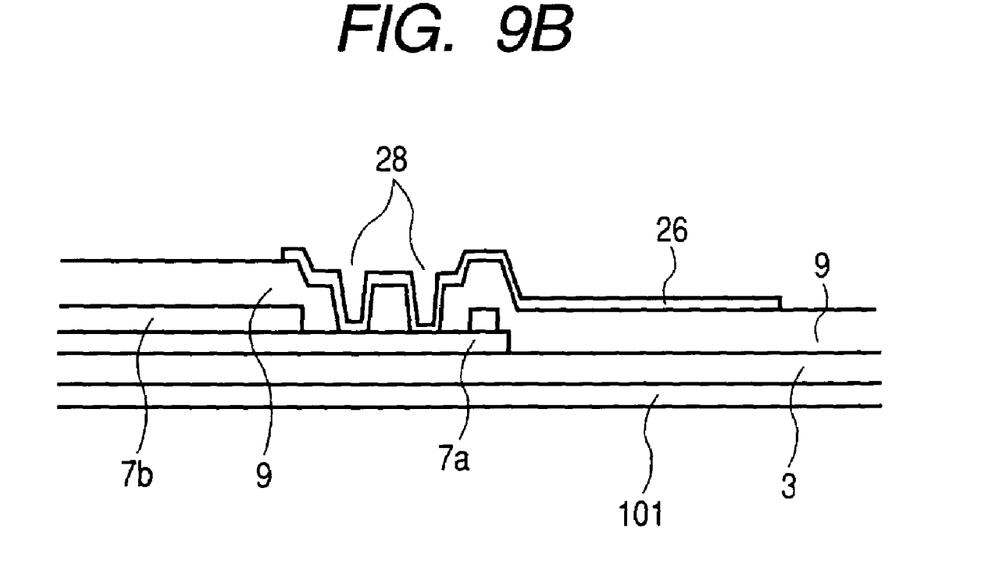

FIG. 1 is a plan view illustrating a TFT array substrate for display device according to Embodiment 1 of implementation of the invention. FIG. 2A is a sectional view of FIG. 1 taken on line X-X. FIG. 2B is an enlarged sectional view of the portion shown by x in FIG. 2A. In FIGS. 1 and 2A, the reference numeral 101 indicates a transparent insulating substrate such as glass substrate, the reference numeral 1 indicates a gate electrode formed on the transparent insulating substrate 101, the reference numeral 21 indicates a gate wiring connected to the gate electrode, the reference numeral 20 an auxiliary capacitance electrode formed on the transparent insulating substrate 101, the reference numeral 3 indicates a gate insulating film formed on the gate electrode 1, the gate wiring 21 and the auxiliary capacitance electrode 20, the reference numeral 4 indicates a semiconductive active layer formed by an amorphous silicon layer formed on the gate electrode 1 with a gate insulating film interposed therebetween, the reference numeral 5 indicates an ohmic contact layer formed by an n+ amorphous silicon layer formed on the semiconductive element layer 4, the reference numeral 7 indicates a source electrode composed of a lower source layer shown by the reference numeral 7a and an upper source layer shown by the reference numeral 7b formed by processing a first thin metal film 6 as shown in FIG. 4, the reference numeral 8 indicates a drain electrode composed of a lower drain layer shown by the reference numeral 8a and an upper drain layer shown by the reference numeral 8b formed by processing the first thin metal film 6, the reference numeral 9 indicates an interlayer insulating film formed by a passivation layer, the reference numeral 10 indicates a pixel contact hole extending to the surface of the drain electrode, and the reference numeral 11 indicates a pixel electrode formed by a transparent electrically-conductive film which comes in electrical contact with the lower drain layer 6a of the drain electrode 8 through the pixel contact hole 10 formed on the interlayer insulating film 9. FIG. 9A is a plan view illustrating a source terminal 27 disposed at the end of a source electrode 22 formed on TFT array substrate of a liquid crystal display device according to Embodiment 1 of implementation of the invention. FIG. 9B is a sectional view of FIG. 9A taken on line X-X. At the source terminal 27, the end of the source wiring 22 and a source terminal pad 26 formed at the same time with the pixel electrode 11 come in electrical contact with each other through a second contact hole 28 formed on the interlayer insulating film 9.

The procedure of preparing a TFT array substrate for display device according to Embodiment 1 of implementation of the invention will be described hereinafter in connection with the attached drawings. At Step A shown in FIG. 3, the transparent insulating substrate 101 such as glass substrate is washed with purified water. A thin metal film is then formed on the transparent insulating substrate 101. Thereafter, a first stage photolithography/etching process is conducted to pattern the thin metal film. Thus, a gate electrode 1, a gate wiring 21 and an auxiliary capacitance electrode 2 are formed. The thin metal film is preferably formed by a metal material having a relatively low resistivity such as aluminum, molybdenum or alloy mainly composed of such a metal.

By way of preferred example, an aluminum film was formed to a thickness of 200 nm by a sputtering method using argon gas, which is known. Referring to sputtering conditions, a DC magnetron sputtering method was used. The film forming power density was 3 W/cm². The argon gas flow rate was 40 sccm. Subsequently, an AlN alloy having nitrogen (N) incorporated therein was deposited to a thickness of 50 nm by a reactive sputtering method using a known argon gas having $N_2$ gas incorporated therein. Referring to sputtering conditions, the film forming power density was 3 W/cm². The argon gas flow rate was 40 sccm. The $N_2$ gas flow rate was 20 sccm. In this manner, a two-layer film consisting of 200 nm aluminum film and 50 nm AlN layer formed thereon was formed. The formulation of nitrogen in the upper AlN layer was about 18% by weight. Thereafter, the two-layer film was etched at once with a known solution of phosphoric acid and nitric acid. The photo-resist pattern was then removed to form the gate electrode 1, the gate wiring 21 and the auxiliary capacitance electrode 2.

Subsequently, at Step B shown in FIG. 3, the gate insulating film 3 made of silicon nitride (SiN), the semiconductive active layer 4 made of amorphous silicon and the ohmic contact layer 5 made of n+ amorphous silicon having impurities incorporated therein were sequentially deposited. Thereafter, a second stage photolithography/etching process is conducted to pattern the semiconductive active layer 4, the ohmic contact layer 5 and the portion at which a thin film transistor is formed in a continuous shape larger than that of the source electrode 7, the source wiring 22 and the drain electrode 8 formed at the subsequent process.

By way of preferred example, a chemical vapor phase deposition (CVD) method was used to deposit an SiN layer to a thickness of 400 nm as a gate insulating film, an amorphous silicon layer to a thickness of 150 nm as a semiconductive active layer and a layer of n+ amorphous silicon having phosphorus (P) incorporated therein to a thickness of 30 nm as an ohmic contact layer in this order. Thereafter, the amorphous silicon layer and the ohmic contact layer were etched by a dry etching method using a known fluorine-based gas. Thereafter, the photo-resist pattern was removed to form semiconductor patterns 4 and 5.

Subsequently, at Step C shown in FIG. 3, the first thin metal film 6a constituting the lower drain layer 8b and the lower source layer 7b and the upper layer 6b of the first thin metal film including aluminum constituting the upper drain layer 8b and the upper source layer 7b were continuously deposited to form a first thin film multi-layer metal film 6 including an upper layer made of aluminum. Thereafter, a photo-resist 24 was spread over the first thin film multi-layer metal film 6. A third stage photolithography process was then conducted to pattern the photo-resist 24 in the area corresponds to the source electrode 7, the source wiring 22 and the drain electrode 8 such that the thickness of the photo-resist layer is reduced only on the lower drain layer exposure area 23. By way of preferred example, the first lower thin metal film 6a is made of chromium, which is advantageous in that it exhibits good contact properties with respect to the ohmic contact layer and excellent contact properties with respect to the pixel electrode formed later and allows mutual etching with the first upper thin metal film 6b made of a metallic material containing aluminum. Besides chromium, titanium, tantalum and tungsten can be used because they have the same advantages as that of chromium.

By way of preferred example, chromium is deposited to a thickness of 200 nm by a sputtering method using argon gas, which is known. Subsequently, aluminum is deposited similarly by a sputtering method. In the case where the drain electrode is not required to have a high reflectance, an AlNd alloy having neodymium incorporated therein in an amount of from 0.1 to 5% by weight is preferably used instead of simple aluminum to inhibit the occurrence of hillocks. The substrate is preferably kept in the condition of vacuum without being exposed to the atmosphere during the period between the deposition of chromium and the deposition of aluminum to inhibit the formation of surface chromium oxide layer that adversely affects the electrical conductivity.

Figure 4A:
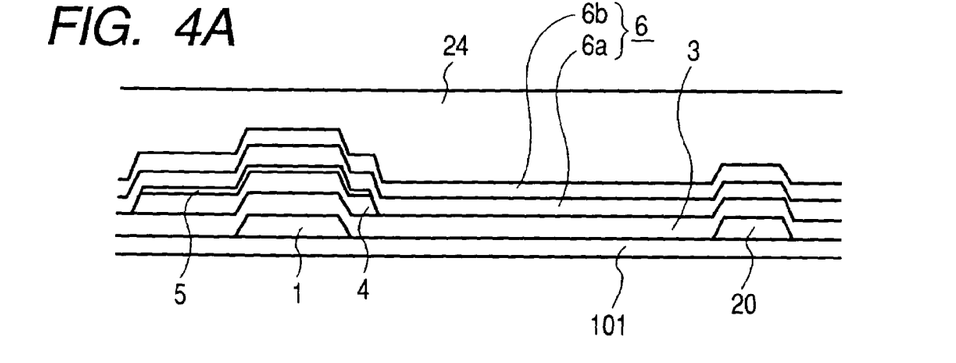
FIGS. 4A to 4D each are sectional views of process or the production of the TFT array substrate according to Embodiment 1 of implementation of the invention.

By way of preferred example of spreading of photo-resist, a novolac resin-based positive-working photo-resist 24 was spread to a thickness of about 1.6 μm by a spin coater, and then prebaked at 120° C. for about 90 seconds as shown in FIG. 4A. By way of preferred example of the third stage photolithography process, a first stage exposure process was conducted to form a pattern of TFT portion source electrode 7, drain electrode 8 and source wiring 22. Subsequently, a second stage exposure process was conducted to form a photo-resist pattern 24b for forming the TFT lower drain layer exposure area 23. In order to form the photo-resist pattern 24b, the photo-resist was not completely removed, but the second stage exposure process was conducted at an exposure of about 40% of that of the first stage exposure process so that the photo-resist layer can be left behind with a small thickness.

Figure 4B:
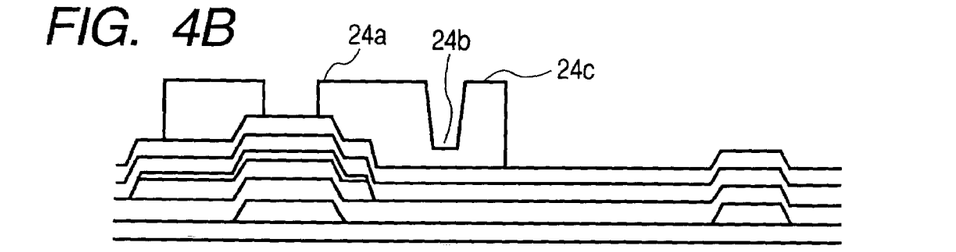

The material which had thus been subjected to two stage exposure processes was developed with an organic alkaline developer, and then post-baked at 120° C. for about 180 seconds to form a photo-resist pattern having at least three thicknesses, i.e., first portion 24b corresponding to the TFT lower drain layer exposure area 23, second portion 24a having a greater thickness than the first portion disposed above the gate electrode pattern 1, portion 24c having a greater thickness than the second portion as shown in FIG. 4B. In the present embodiment, a photo-resist pattern was formed such that the thickness of the first portion 24b, the second portion 24a and the third portion 24c were about 0.4 μm, about 1.2 μm and about 1.6 μm, respectively.

While the present embodiment has been described with reference to the case where two stage exposure processes are conducted, a photo-resist pattern having portions 24a, 24b and 24c may be formed at once through a photo-mask having such a halftone that the transmission of the pattern area disposed at 24b is about 40%. The halftone pattern mask can be formed by forming a filter membrane capable of reducing the transmission at the wavelength used for exposure (normally from 350 nm to 450 nm) to about 40% in the pattern area disposed at the photo-mask 24b or formed as a slit-shaped pattern by making the use of light diffraction phenomenon. When this halftone mask is used, photo-resist patterns 24a, 24b and 24c can be formed at once by only one exposure process, making it possible to simplify the process.

Subsequently, the upper layer 6b made of aluminum of the first thin metal film was subjected to first stage etching with a known solution containing phosphoric acid and nitric acid with the photo-resist patterns 24a, 24b and 24c shown in FIG. 4B as photo-mask. The substrate was washed with purified water, dried, and then subjected to etching with a solution containing cerium ammonium nitrate and nitric acid to remove the lower layer 6a made of chromium of the first thin metal film. Thus, the source electrode 7 and the drain electrode 8 were formed. Thereafter, photo-resist ashing using a known oxygen plasma was conducted to remove the photo-resist 24b from the first portion. At the same time, the photo-resist pattern 24 was etched such that the second portion 24a and the third portion 24c are left behind. Thus, photo-resist patterns 24a and 24c as shown in FIG. 4C which are opened at the portion of the photo-resist 24b disposed at the lower drain layer exposure area 23 were formed.

Subsequently, the upper drain layer 8b which is an upper layer made of aluminum or aluminum alloy of the first thin metal film was etched away from the area where it is exposed at the first portion 24b with a known solution containing phosphoric acid and nitric acid to expose the lower drain layer 8a which is a lower layer of the first thin metal film. Thus, a drain exposure area 23 was formed. Thereafter, the ohmic contact layer 5 made of amorphous silicon was etched away by a dry etching method using a known fluorine-based gas to form a structure shown in FIG. 4D. The photo-resist patterns 24a and 24c were then removed to form the source electrode 7, the drain electrode 8 and the lower drain layer exposure area 23. As shown in FIG. 9A, a lower source layer exposure 25 may be formed similarly at the source terminal 27.

Figure 4C:
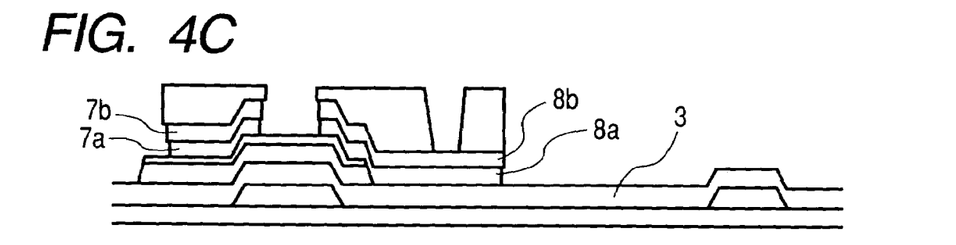
Figure 4D:
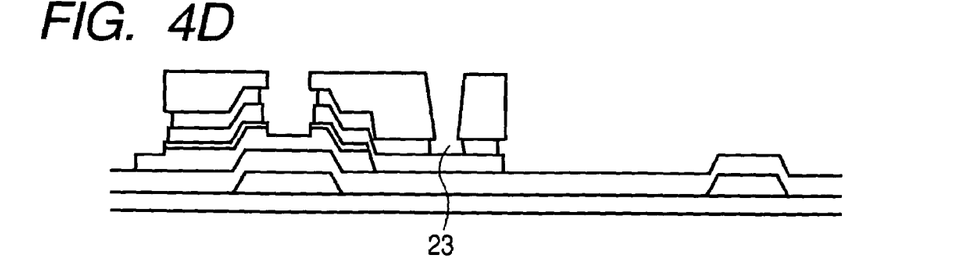

In the case where the etching of the upper drain layer 8b of made of aluminum or aluminum alloy of the first thin metal film which has been exposed after the removal of the photo-resist from the first portion 24b is carried out by isotropic etching such as wet etching, the patterned edge of the upper drain layer 8b which is an upper layer of the first thin metal film is disposed outside the patterned edge of the lower drain layer 8a which is a lower layer of the first thin metal film as shown in the channel portion of FIG. 4C before etching but is disposed inside the patterned edge of the lower drain layer 8a after etching. By optimizing the isotropic etching time, the amount by which the patterned edge of the upper drain layer 8a is disposed inside the patterned edge of the lower drain layer 8a can be predetermined to almost not greater than the thickness of the upper drain layer 8b which is an upper layer of the first thin metal film. It is thus difficult for ordinary etching to dispose the patterned edge of the upper drain layer 8b which is an upper layer of the first thin metal film in close proximity to and inside the patterned edge of the lower drain layer 8a which is a lower layer of the first thin metal film. In the aforementioned arrangement, the shrinkage of the upper layer 6b of the first thin metal film can be minimized in addition to the improvement of the coatability of the insulating film described later, making it possible to inhibit the rise of wiring resistance.

While the present embodiment has been described with reference to the case where the ohmic contact layer 5 is etched away shortly before the removal of photo-resist pattern, the etching of the ohmic contact layer 5 may be continuously conducted before or after the photo-resist ashing to enhance the production capacity.

Subsequently, at Step E shown in FIG. 3, the formation of the interlayer insulating film 9 is followed by patterning by a fourth stage photolithography/etching process whereby a pixel contact hole 10 extending to the surface of the lower drain layer exposure area 23, a first contact hole (not shown) extending to the surface of the terminal portion disposed at the end of the gate wiring and a second contact hole 28 extending to the surface of the terminal portion disposed at the end of the source wiring 22 formed by the first thin metal film are formed at the same time on at least the first thin metal film.

By way of preferred example, a chemical vapor phase deposition (CVD) method was used to for an $SiO_2$ layer or SiN layer to a thickness of from 100 to 300 nm as an interlayer insulating film. A photo-resist pattern was then formed on the interlayer insulating film. The interlayer insulating film 9 was then etched by a dry etching method using a known fluorine-based gas. Thereafter, the photo-resist pattern was removed to form the pixel drain electrode contact hole 10, the gate terminal contact hole (not shown) and the source terminal second contact hole 28. In order to form the gate terminal contact hole, it is necessary that both the interlayer insulating film 9 and the gate insulating film 3 be etched. The gate insulating film 3 may be previously removed after the formation of the semiconductor patterns 4 and 5.

Further, the interlayer insulating film may be formed by spreading an organic resin layer instead of SiN layer or $SiO_2$ layer, and then patterning the coat layer by exposure and development or by spreading an organic resin layer over the SiN layer, exposing the coat layer, developing the coat layer, and then subjecting SiN layer to dry etching or the like to form an opening therein. In this manner, there can be exerted an effect of leveling the uneven surface of the element under the interlayer insulating film.

While the pixel drain electrode contact hole 10 extends to the surface of the lower drain layer exposure area 23, the contact hole 10 may include at least a part of the lower drain layer exposure area 23. For example, the area other than the lower drain layer exposure area 23 may be included. Alternatively, only a part of the lower drain layer exposure area 23 may be exposed. Accordingly, the positioning of the opening can be easily made. In the case where the upper drain layer 8b, too, is exposed in the contact hole 10 as shown in FIG. 1 and FIGS. 2A and 2B, the upper drain layer 8b may make direct contact with the pixel electrode formed later but has little or no practical electrical conduction to the pixel electrode and thus can be difficultly said to be electrically connected to the pixel electrode. The area 30 in the drain electrode 8 which is electrically connected to the pixel electrode formed by the second thin metal film is an area disposed in the lower drain layer exposure area 23 formed using the photo-resist 24b, particularly an area exposed through the contact hole 10

In the present embodiment, the upper layer 6b of the first thin metal film is etched twice as previously mentioned to include the patterned edge of the upper layer 6b of the first thin metal film in the pattern of the lower layer 6a of the first thin metal film disposed under the upper layer 6b. In this arrangement, even in the case where the thickness of the interlayer insulating film is small, the covering properties of the step portion in the source electrode, the source wiring and the drain electrode by the interlayer insulating film is good, making it possible to exert an effect of preventing the leakage of electricity to the liquid crystal, enhancing the covering properties of EL material and enhancing the covering properties of the pixel electrode at the drain electrode step portion.

Figure 3:
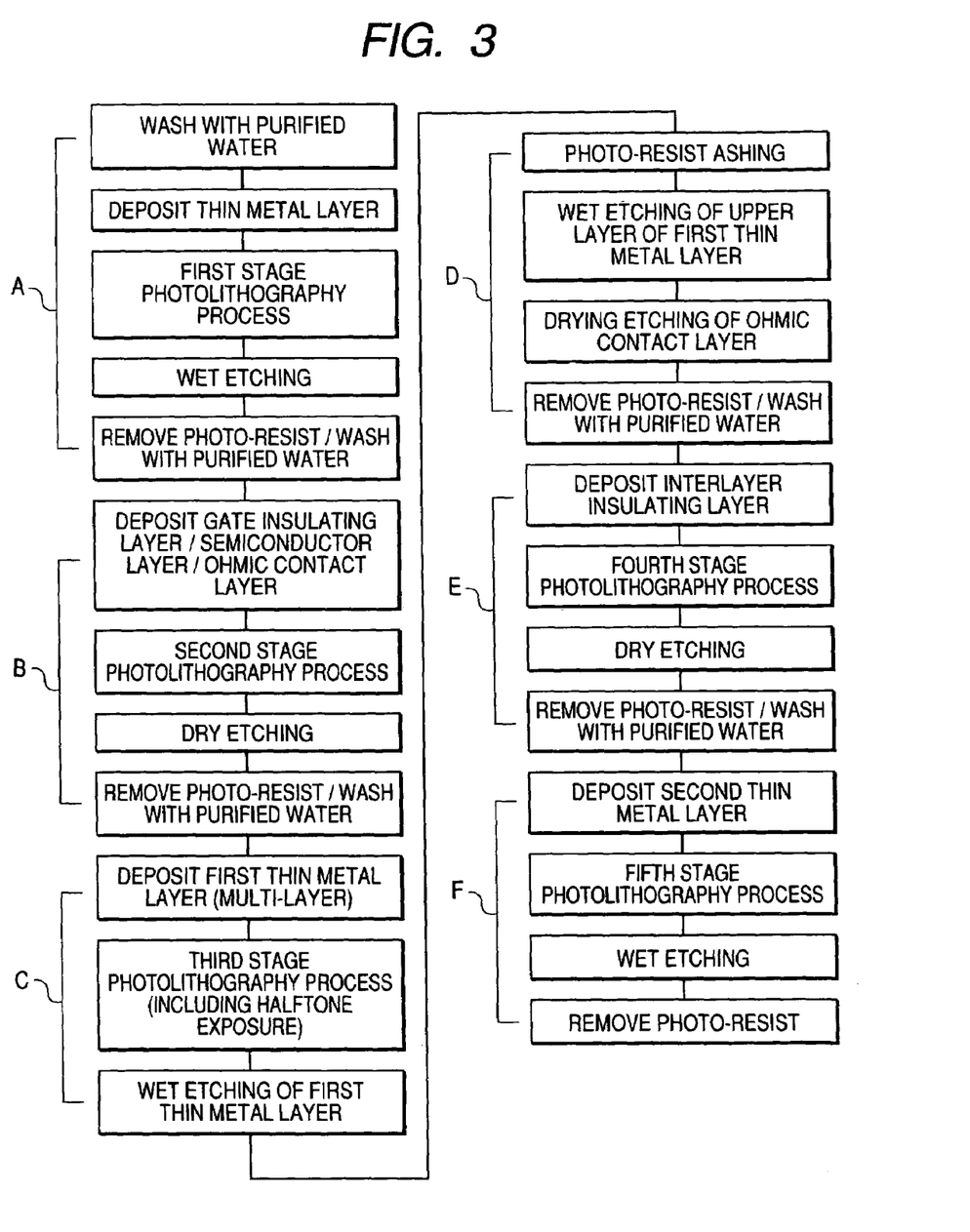
FIG. 3 is a flow chart of production of the TFT array substrate according to Embodiment 1 of implementation of the invention.

Finally, at Step F shown in FIG. 3, a transparent electrically-conductive film was formed as a second thin metal film. Thereafter, a fifth stage photolithography/etching process was conducted to make patterning. In this manner, a pixel electrode 11 was formed which makes electrical connection to the lower drain layer exposure area 23 through the pixel electrode contact hole 10. Further, a gate terminal (not shown) was formed having a terminal pad electrically connected to the lower gate terminal portion through the first contact hole. Moreover, a source terminal 27 was formed having a source terminal pad 26 electrically connected to the lower source layer exposure 25 in the source terminal portion as shown in FIG. 9. Thus, a TFT array substrate for display device according to Embodiment 1 of implementation of the invention was completed. By way of preferred example, an ITO layer including indium oxide ($In_2O_3$) and tin oxide ($SnO_2$) incorporated therein was formed to a thickness of 100 nm as a transparent electrically-conductive film by a sputtering method using an argon gas, which is known. The ITO layer thus formed was etched with a known solution containing hydrochloric acid and nitric acid, and then freed of photo-resist pattern to form the pixel electrode 11, the gate terminal (not shown) and the source terminal 27.

While the present embodiment has been described with reference to the case where as the transparent electrically-conductive film there is used ITO (indium oxide and tin oxide), the invention is not limited thereto. A transparent electrically-conductive film including at least one of indium oxide, tin oxide and zinc oxide may be used. For example, in the case where an IZO layer including zinc oxide incorporated in indium oxide is used, a weak acid such as oxalic acid can be used as an etching solution instead of strong acid such as mixture of hydrochloric acid and nitric acid used in the aforementioned embodiment. Accordingly, in the case where an aluminum alloy having a poor acid durability is used as the gate electrode material or first then metal film as in the invention, the break and corrosion of the aluminum alloy film due to the penetration of chemical can be prevented to advantage. Further, in the case where the sputtered layer of indium oxide, tin oxide and zinc oxide has an oxygen content of less than the stoichiometric amount of oxygen to have a poor transmission or resistivity, the deposition is preferably conducted in an atmosphere of an argon gas including oxygen or $H_2O$ incorporated therein rather than single argon gas as a sputtering gas.

In accordance with Embodiment 1, the contact resistance of the drain electrode formed by processing the laminate of an upper drain layer and a lower drain layer made of aluminum or aluminum alloy material with respect to the pixel electrode can be lowered without adding to the number of photo-mask, making it possible to exert an effect of producing a wide screen thin film transistor array substrate having a reduced rise of wiring resistance and contact resistance at reduced cost.

Figure 10A:
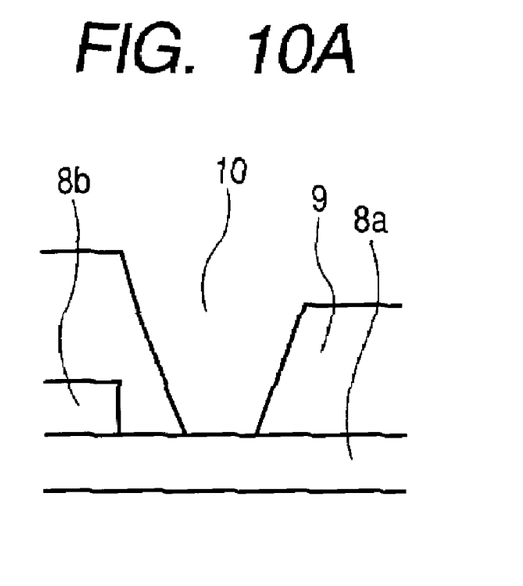
FIGS. 10A and 10B are sectional views illustrating a process according to the invention.
Figure 10B:
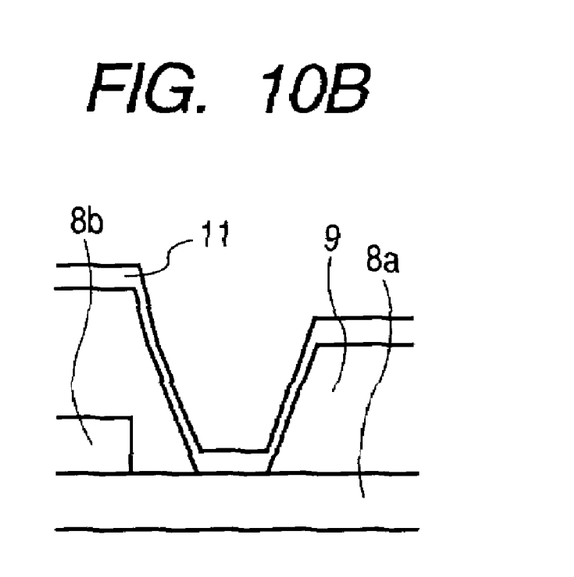
Figure 11A:
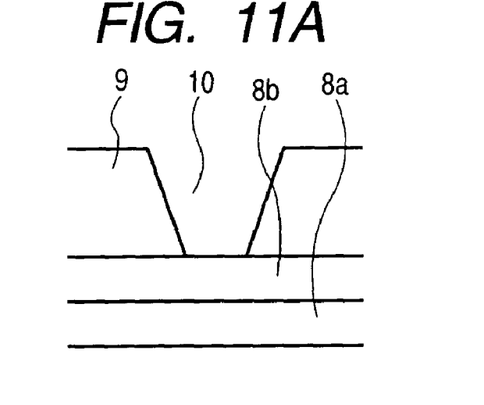
FIGS. 11A to 11C are sectional views illustrating the related art process.
Figure 11B:
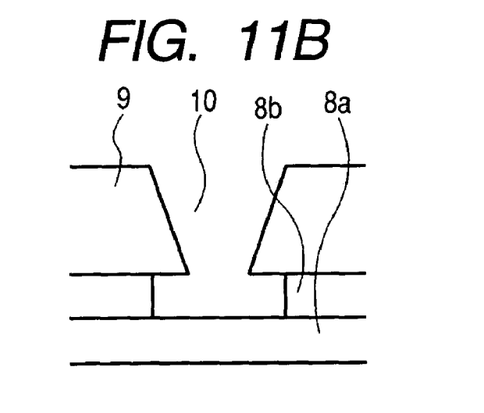
Figure 11C:
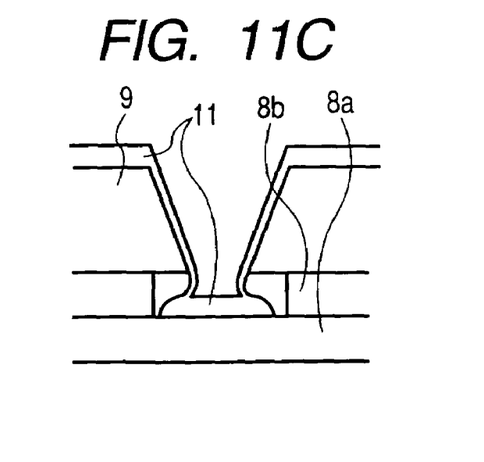

Further, the present embodiment doesn't employ a method involving the etching/removal of the first thin metal film after the formation of the contact hole 10. Thus, in the contact hole 10, the side wall of the interlayer insulating film comes in contact with the drain electrode 8 without protruding in the form of visor. This configuration will be further described in connection with FIGS. 10 and 11. FIG. 11A depicts how the contact hole 10 is formed in the interlayer insulating film 9 in the related art examples. FIG. 11B depicts the configuration developed after the etching/removal of the upper drain layer 8b thus exposed. When the pixel electrode 11 is formed under these conditions, the covering properties of the pixel electrode 11 is deteriorated at the site where the side wall of the interlayer insulating film 9 protrudes in the form of visor in the periphery of the contact hole as shown in FIG. 1C. Further, the pixel electrode 11 makes insufficient contact with the lower drain layer 8a, which acts as a substrate for the pixel electrode 11. In the present embodiment, on the other hand, at the time when the contact hole 10 is formed, the side wall of the interlayer insulating film comes in contact with the drain electrode 8 without protruding in the form of visor as shown in FIG. 10A. Thus, the pixel electrode 11 is formed as shown in FIG. 10B. It is thus made obvious that the aforementioned defects cannot occur. As mentioned above, the present embodiment is advantageous in that the pixel electrode has good covering properties that can assure a good electrical contact between the pixel electrode and the lower drain layer.

EMBODIMENT 2

Figure 5:
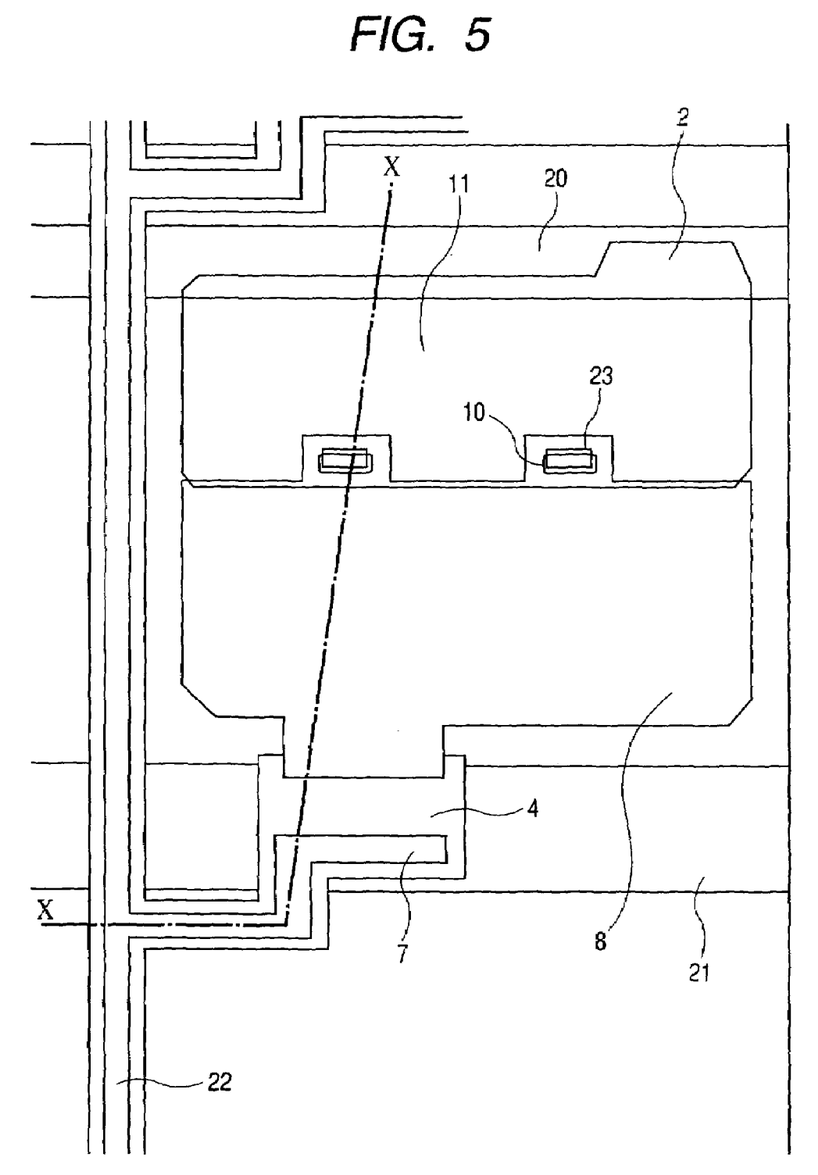
FIG. 5 is a top view of a TFT array substrate according to Embodiment 2 of implementation of the invention.
Figure 6:
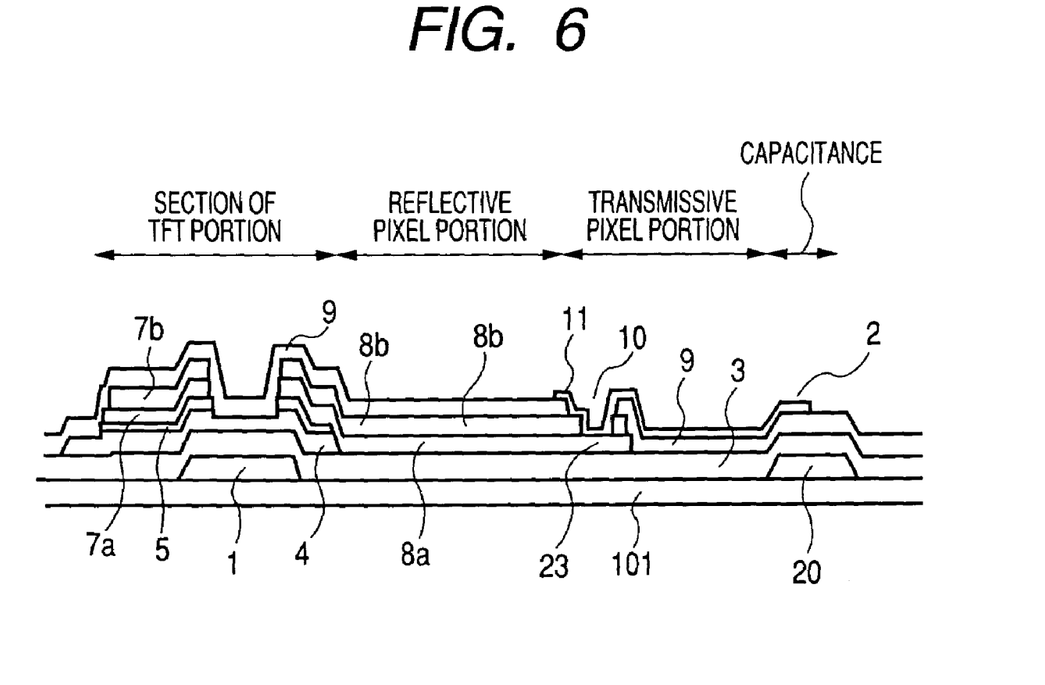
FIG. 6 is a sectional view of the TFT array substrate according to Embodiment 2 of implementation of the invention.

While Embodiment 1 has been described with reference to TFT array substrate for liquid crystal display device having a transmission pixel electrode and its production method wherein as the pixel electrode material there is used a transparent electrically-conductive material, the invention may be applied to so-called semi-transmission type TFT array substrate for liquid crystal display device including a transmission type pixel electrode and a reflective pixel electrode. FIG. 5 is a plan view illustrating a TFT array substrate for liquid crystal display device according to the present embodiment of implementation of the invention. FIG. 6 is a sectional view taken on line X-X of FIG. 5. In FIGS. 5 and 6, the reference numeral 101 indicates a transparent insulating substrate such as glass substrate, the reference numeral 1 indicates a gate electrode formed on the transparent insulating substrate 101, the reference numeral 21 indicates a gate wiring connected to the gate electrode, the reference numeral 2 indicates an auxiliary capacitance electrode formed on the transparent insulating substrate 101, the reference numeral 4 indicates a semiconductive active layer formed by an amorphous silicon layer formed on the gate electrode 1 with a gate insulating film interposed therebetween, the reference numeral 6 indicates an ohmic contact layer formed by an n+ amorphous silicon layer formed on the semiconductive active layer 4, the reference numeral 6 indicates a first thin metal film formed on the ohmic contact layer 5 or the gate insulating film 3, the first thin metal film 6 being composed of a first lower thin metal film shown by the reference numeral 6a and a first upper thin metal film shown by the reference numeral 6b, the reference numeral 7 indicates a source electrode formed by the first thin metal film 6, the source electrode 7 being composed of a lower source layer shown by the reference numeral 7a and an upper source layer shown by the reference numeral 7b, the reference numeral 8 indicates a drain electrode made of the first thin metal film 6, the drain electrode 8 being composed of a lower drain layer shown by the reference numeral 8a and an upper drain layer shown by the reference numeral 8b, the reference numeral 9 indicates an interlayer insulating film formed by a passivation layer, the reference numeral 10 indicates a pixel contact hole extending to the surface of the drain electrode, and the reference numeral 11 indicates a pixel electrode formed by a transparent electrically-conductive film which makes electrical contact with the lower drain layer 8a of the drain electrode 8 through the pixel contact hole 10 formed in the interlayer insulating film 9. The source terminal 27 is the same as described with reference to Embodiment 1 in connection with FIG. 9.

Embodiment 2 differs from Embodiment 1 only in that the drain electrode 8 extends to the pixel region and is capable of reflecting incident light as a reflective pixel electrode. The other configurations of Embodiment 2 are the same as that of Embodiment 1. The production method of Embodiment 2 is the same as that of Embodiment 1 except that the photo-mask to be used at Step C is changed. Accordingly, although the production method of Embodiment 1 requires that at least one step of depositing a metal film and patterning the metal film be added to form a reflective pixel electrode, the production method of Embodiment 2 requires no such an addition, making it possible to contribute to the reduction of production time and cost.

Further, since the patterned edge of the upper drain layer 8b is disposed inside the patterned edge of the lower drain layer 8b as shown in FIG. 4C, the covering properties of the interlayer insulating film 9 and the pixel electrode 11 at the step portion of the drain electrode 8 is good to advantage. Moreover, in accordance with the present embodiment, the formation of the contact hole is not followed by the etching/removal of the upper drain layer 8b, which is an upper layer of the first thin metal film. In this manner, the upper drain layer 8b undergoes no side etching. Further, in the contact hole, the side wall of the interlayer insulating film comes in contact with the surface of the drain electrode without protruding in the form of visor. In this arrangement, the pixel electrode can cover fairly the contact hole in the area ranging from the side to the bottom thereof without any stepwise intermission to advantage.

EMBODIMENT 3

While Embodiment 2 has been described with reference to the case where the invention is applied to a semi-transmission type TFT array substrate for liquid crystal display device, Embodiment 3 has a drain electrode 8 disposed under the interlayer insulating film 9, which drain electrode 8 acting as a reflective pixel electrode as well, as shown in FIG. 6. In this structure, deterioration of display properties attributed to interference or multiple reflection caused by the interfacial reflection on the upper layer and the lower layer of the interlayer insulating film 9 can occur. Embodiment 3 is characterized in that the interlayer insulating film 9 covering the drain electrode 8 at the pixel area is removed to position the drain electrode 8 as an uppermost layer. The configuration thus developed is shown in the top view of FIG. 7 and the sectional view of FIG. 8.

Figure 7:
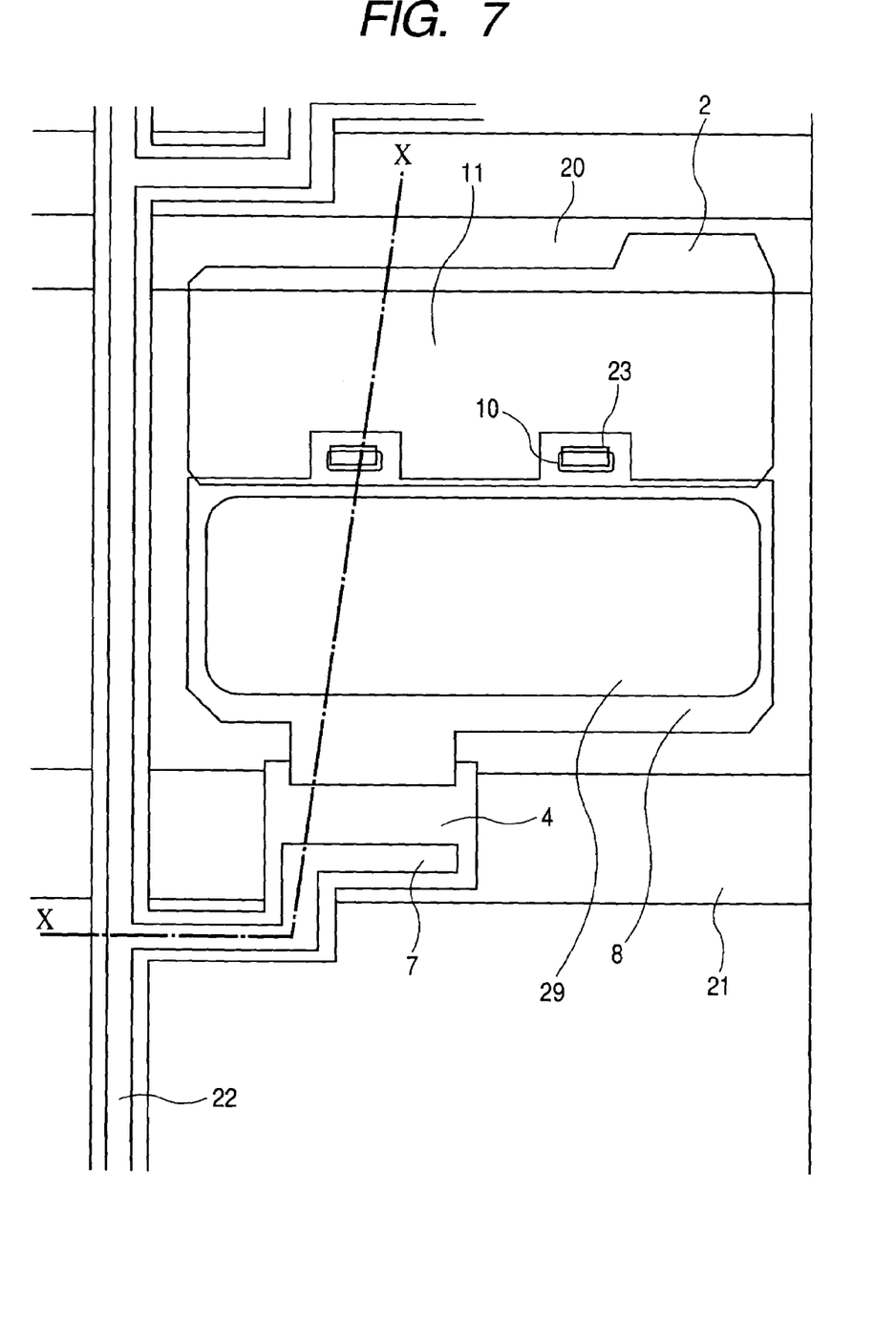
FIG. 7 is a top view of a TFT array substrate according to Embodiment 3 of implementation of the invention.
Figure 8:
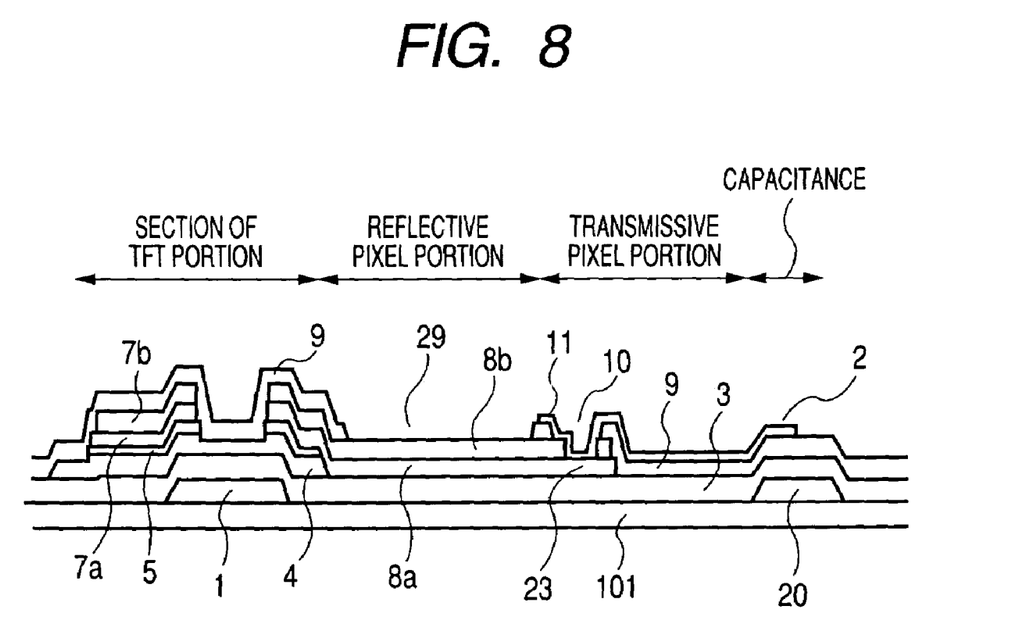
FIG. 8 is a sectional view of the TFT array substrate according to Embodiment 3 of implementation of the invention.

FIG. 7 depicts substantially the same configuration as shown in FIG. 5 described in Embodiment 2. Accordingly, where the parts are the same, their description is omitted. Embodiment 3 differs from Embodiment 2 in that an opening 29 is formed on the pixel electrode by removing the interlayer insulating film 9 on the drain electrode 8 in the pixel area. In order to form the opening 29 on the pixel electrode, the photo-mask to be used in the formation of the pixel contact hole 10 or the second contact hole 28 at Step E may be changed. In this manner, the opening 29 can be formed at the same time with the pixel contact hole 10 or the second contact hole 28. Since a semi-transmission type TFT array substrate for liquid crystal display device including a drain electrode acting as a reflective pixel electrode formed at the uppermost layer without adding to the number of depositing or patterning steps as in Embodiment 2, the reflectivity of the pixel electrode can be enhanced without adding to the production period and cost to advantage.

EMBODIMENT 4

While Embodiments 1 to 3 have been described with reference to the configuration including a drain electrode 8 composed of an upper layer made of aluminum and a pixel electrode 11 formed by a transparent electrically-conductive material which are electrically connected to each other, the invention is useful also in the case where the pixel electrode is not made of transparent electrically-conductive material. For example, in order to incorporate a TFT array substrate in a display device such as liquid crystal display device, it is necessary that a driving IC be connected to a source terminal provided at the end of the source wiring for transmitting image signal to the source wiring. In some detail, an IC tape is stuck to a source terminal pad 26 of source terminal 27 as shown in FIG. 9 to mount a driving IC. However, in the case where as the source terminal pad 26 there is used a metal film, it is likely that disconnection can occur due to oxide layer formed on the surface of the metal film. Thus, an oxide-based electrically-conductive material is occasionally used. A preferred example of such an oxide-based electrically-conductive material is a transparent electrically-conductive material containing at least one of indium oxide, tin oxide and zinc oxide. In accordance with the present embodiment, in the case where as a wiring material for reducing the wiring resistance of a wide screen display device there is used aluminum and as the source terminal pad there is used a transparent electrically-conductive material as mentioned above, a source terminal having a reduced rise of contact resistance can be formed in the same manner as in Embodiment 1 as shown in FIGS. 9A and 9B.

In the present embodiment, in the case where it is necessary that aluminum, which has a low resistivity, be used as a source wiring to lower the wiring resistance and act also as a reflective pixel electrode and an oxide-based electrically-conductive material be used as a source terminal pad even if the pixel electrode is not formed by a transparent electrically-conductive material as in the array substrate for driving a reflective display device, good electrical conduction can be obtained at the area where the terminal is mounted without adding a step of covering the aluminum wiring layer by other metal.

While the present embodiment has been described with reference to so-called inverted staggered type thin film transistor including a semiconductor layer formed by an amorphous silicon layer and a gate electrode disposed at the lower most layer, the silicon layer may be formed by a crystallized silicon layer. The invention can be applied to co-planar thin film transistor.

While the invention concerns a thin film transistor array substrate which has a low contact resistance between a source wiring including a metal material having a high light reflectivity and a low resistivity as an uppermost layer and a pixel electrode or source terminal pad and hence good display properties and a method of producing the same, it goes without saying that the invention can be applied also to an active matrix type display device such as liquid crystal display device and electroluminescence display device and a method of producing the same. The thin film transistor array substrate obtained according to the invention and a color filter are then laminated on each other. A liquid crystal is enclosed in the laminate to complete a liquid crystal display device. Alternatively, a layer including an organic EL material and opposing electrodes are formed on the thin film transistor array substrate obtained according to the invention. The organic EL material layer and the opposing electrodes are then enclosed in such an arrangement that they are not exposed to the atmosphere to complete an electroluminescence display material.

What is claimed is:

1. A thin film transistor array substrate comprising:

an insulating substrate;

a thin film transistor formed on the insulating substrate;

a display pixel formed on the insulating substrate, the display pixel having a pixel electrode connected to a drain electrode of the thin film transistor;

the thin film transistor including a first thin metal multi-layer film, an upper layer of which includes aluminum, formed on the insulating substrate; and the display pixel including a second thin metal film formed of a transparent electrically-conductive film formed on the first thin metal film with an interlayer insulating film interposed therebetween, wherein the interlayer insulating film has a first opening, and the upper layer of the first metal film has a second opening that includes an overlapped area with the first opening, the overlapped area of the second opening in which a lower layer of the first thin metal film and the second thin metal film are connected to each other, and the interlayer insulating film comes in contact with the second thin metal film and the lower layer of the first thin metal film in the second opening.

2. The thin film transistor array substrate according to claim 1, wherein
the first thin metal film has a function of a reflective pixel electrode for a pixel portion.

3. The thin film transistor array substrate according to claim 2, wherein
the reflective pixel electrode has a region where the interlayer insulating film is not covered but exposed.

4. The thin film transistor array substrate according to claim 1, wherein
the lower layer of the first thin metal film includes any of chromium, titanium, tantalum and tungsten, and
the pixel electrode is formed of a transparent electrically-conductive material.

5. The thin film transistor array substrate according to claim 4, wherein
the transparent electrically-conductive material includes indium oxide having tin oxide incorporated therein or at least one of indium oxide, tin oxide and zinc oxide.

6. The thin film transistor array substrate according to claim 1, wherein
a patterned edge of the upper layer of the first thin metal film, which includes a film including aluminum is recessed from a patterned edge of the lower layer of the first thin metal film by an amount which is not greater than a thickness of the film including aluminum.

7. The thin film transistor array substrate according to claim 1, further comprising:
a source wiring formed of the first thin metal film; and
a pad for a source terminal formed of the second thin metal film.

* * * * *